United States Patent
Kita (10) Patent No.: US 7,102,274 B2
(45) Date of Patent: Sep. 5, 2006

(54) PIEZOELECTRIC DEVICE AND ITS MANUFACTURING METHOD

(75) Inventor: Hiroyuki Kita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 172 days.

(21) Appl. No.: 10/847,316

(22) Filed: May 18, 2004

(65) Prior Publication Data

US 2004/0232804 A1   Nov. 25, 2004

(30) Foreign Application Priority Data

May 20, 2003   (JP)   ............................. 2003-141733

(51) Int. Cl.
*H01L 41/08*   (2006.01)

(52) U.S. Cl. ..................... 310/358; 252/62.9; 310/311; 310/328; 310/330

(58) Field of Classification Search ........ 310/357–359, 310/311; 252/62.9
See application file for complete search history.

(56) References Cited

U.S. PATENT DOCUMENTS

| | | | |
|---|---|---|---|
| 6,204,525 B1 * | 3/2001 | Sakurai et al. ............... | 257/295 |
| 6,613,585 B1 * | 9/2003 | Sakurai et al. ................. | 438/3 |
| 6,642,539 B1 * | 11/2003 | Ramesh et al. ................ | 257/43 |
| 6,720,443 B1 * | 4/2004 | Yoshisato .................... | 558/274 |
| 7,008,669 B1 * | 3/2006 | Natori et al. ............. | 427/126.3 |
| 2002/0048124 A1 | 4/2002 | Kuwajima et al. | |

FOREIGN PATENT DOCUMENTS

| | | |
|---|---|---|
| JP | 6-049638 | 2/1994 |
| JP | 6-350154 | 12/1994 |
| JP | 2002-203384 | 7/2002 |
| JP | 2002-279742 | 9/2002 |

OTHER PUBLICATIONS

R. Takayama et al., "Preparation of epitaxial $Pb(Zr_xTi_{1-x})O_3$ thin films and their crystallographic, pyroelectric, and ferroelectric properties", J. Appl. Phys. 65 (4), Feb. 15, 1989, pp. 1666-1670.

* cited by examiner

*Primary Examiner*—Mark Budd
(74) *Attorney, Agent, or Firm*—Wenderoth, Lind & Ponack, L.L.P.

(57) ABSTRACT

A piezoelectric device includes a first electrode film, a second electrode film, and a piezoelectric thin film enclosed by the first electrode film and second electrode film, in which the piezoelectric thin film is an oxide piezoelectric thin film having an oxygen deficiency amount of more than 0% and not more than 10% of the stoichiometric composition. The piezoelectric device composed of the piezoelectric thin film having such oxygen deficiency has a greater piezoelectric performance as compared with the oxide piezoelectric thin film in an oxidized state of stoichiometric composition, and by manufacturing under such a condition, the film forming speed is increased, so that the mass producibility can be improved.

9 Claims, 6 Drawing Sheets

PIEZOELECTRIC DEVICE AND ITS MANUFACTURING METHOD

FIELD OF THE INVENTION

The present invention relates to a piezoelectric device having a piezoelectric thin film, and its manufacturing method.

BACKGROUND OF THE INVENTION

Piezoelectric thin films are processed into various piezoelectric devices depending on their intended purpose, and are widely used as electronic components such as an actuator for deforming a device by applying a voltage, or a sensor for generating a voltage by deforming the device. For example, Japanese Laid-open Patent No. 2002-279742 discloses a technology of fine control of a head position in a magnetic disk by using a piezoelectric device. The piezoelectric device is used because the recording density of the magnetic disk is increased, the area of a recording region of one bit is decreased, and it is difficult to obtain a sufficient precision by positioning of the head using only the conventional voice coil motor. Accordingly, in addition to positioning by utilizing the voice coil motor, it has been considered to compose a two-stage actuator for positioning at high precision in a very small region by a piezoelectric device. A piezoelectric device unit used for this purpose is composed of a pair of piezoelectric devices, which are disposed so that one of the piezoelectric devices is contracted when the other of the piezoelectric devices is expanded, and therefore, the head provided at the leading end can be moved finely at a high precision on the disk surface.

Such a piezoelectric device is generally manufactured in the following manner. A substrate for the piezoelectric device is, for example, a magnesium oxide single crystal substrate (MgO substrate). On this MgO substrate, a platinum film (Pt film) oriented by (100) is formed. On this Pt film, a lead zirconate titanate (PZT) thin film oriented by (001) is formed. Further, an electrode thin film is formed on the PZT thin film, and these thin films are processed into a specified shape by photolithography and etching. Finally, by removing the MgO substrate by etching or other process, a piezoelectric device is fabricated.

For forming a PZT thin film, a sputtering method is generally employed, and its substrate temperature is 550 to 650° C. By sputtering at such a high temperature, lead (Pb) is evaporated from the PZT thin film in the sputtering process, and the final fabricated PZT thin film deviates from the stoichiometric composition due to a decrease of Pb composition. To obtain the PZT thin film of stoichiometric composition, Takayama et al. attempted to compensate for the Pb component in the PZT thin film by composing the target for sputtering to contain Pb by about 20% in excess, and forming the film by using this target (J. Appl. Phys. 65 (4), 1666, 1989).

However, to obtain the PZT thin film of stoichiometric composition by using the target containing Pb in excess, it is necessary to add oxygen gas to an inert gas as a discharge gas for sputtering, and form the film by sputtering in a condition of relatively high pressure. Under such a condition, the film forming speed cannot be increased. When used as a piezoelectric device, the PZT thin film is required to form about 1 µm to 10 µm in thickness, and the mass productivity is extremely reduced at a slow film forming speed.

Japanese Laid-open Patent No. H6-49638 discloses a technology of sputtering at a relatively low discharge gas pressure in a vacuum apparatus which increases the film forming speed when forming a PZT thin film for use in a semiconductor memory. When the discharge gas pressure is low, the Pb component in the formed film is likely to decrease, and therefore, to fabricate a PZT thin film of stoichiometric composition, a target of excessive Pb composition is used depending on the discharge gas pressure.

On the other hand, Japanese Patent Publication No. 3341357 discloses a technology of increasing the piezoelectric constant $d_{31}$ by utilizing excessive Pb in the thin film fabricated for improving the piezoelectric characteristics of the PZT thin film more than in the stoichiometric composition, and forming a rhombohedral crystal structure.

In the first prior art example and the second prior art example, however, both methods aim to fabricate a PZT thin film of stoichiometric composition, and it is necessary to form the film by sputtering in a discharge gas of relatively high oxygen partial pressure. In the PZT thin film formed at such high oxygen partial pressure, the piezoelectric constant $d_{31}$ is generally small, and the film forming speed in sputtering cannot be increased. Hence, good piezoelectric characteristics are not obtained, and the mass producibility is not improved.

In the third prior art example, the Pb amount in the PZT thin film is in excess of the summed amount of titanium (Ti) and zirconium (Zr), but the ratio of oxygen (O) and Pb in the PZT thin film is increased at a same rate, and oxygen deficiency does not take place. Accordingly, when forming the film, oxygen must be added and sputtering must be done in the condition of high discharge gas pressure, and therefore, the film forming speed is not increased. Hence, mass productivity is not improved.

SUMMARY OF THE INVENTION

The present invention is based on the finding that an appropriate oxygen deficiency amount for an oxide piezoelectric thin film contributes to an improvement of the piezoelectric constant $d_{31}$ and the realization of a piezoelectric device having favorable piezoelectric characteristics, and hence, presents a piezoelectric device having excellent piezoelectric characteristics, an increased film forming speed, and an enhanced mass productivity, and a method of manufacturing the same.

To solve the above discussed problems, the piezoelectric device of the present invention comprises:

a first electrode film, a second electrode film, and a piezoelectric thin film enclosed by the first electrode film and the second electrode film, wherein the piezoelectric thin film is an oxide piezoelectric thin film having an oxygen deficiency amount of more than 0% and not more than 10% of the stoichiometric composition.

By using the oxide piezoelectric thin film having such an oxygen deficiency, a piezoelectric device having a more favorable piezoelectric characteristic than before can be obtained, and the film can be formed at a high speed, and hence, the characteristics of the piezoelectric device are enhanced, and improvement of mass productivity is realized.

DETAILED DESCRIPTION OF THE EXEMPLARY EMBODIMENTS

An exemplary embodiment of the invention is described below while referring to the accompanying drawings. In the following drawings, same elements are identified with same reference numerals, and duplicate explanation may be omitted.

First Exemplary Embodiment

Figure 1:
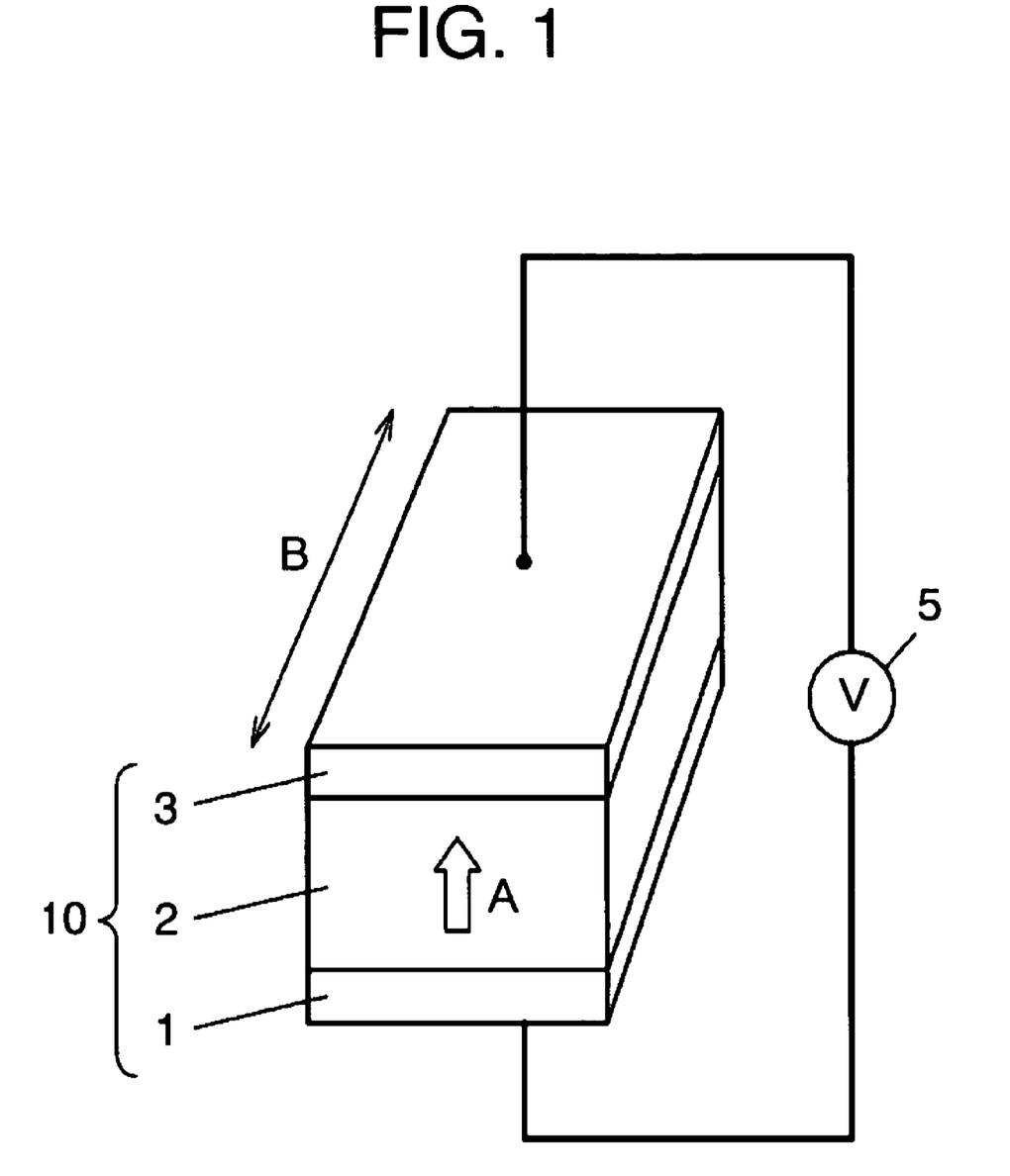
FIG. 1 is a perspective view of a piezoelectric device in an exemplary embodiment of the invention.

FIG. 1 is a perspective view of a piezoelectric device 10 in a first exemplary embodiment of the invention. FIG. 1 also shows a driving power source 5 for driving this piezoelectric device 10.

The piezoelectric device 10 comprises a first electrode film 1, an oxide piezoelectric thin film 2 formed on the first electrode film 1, and a second electrode film 3 formed on the oxide piezoelectric thin film 2. The first electrode film 1, oxide piezoelectric thin film 2, and second electrode film 3 are formed by thin film deposition technology such as sputtering, and processed in a nearly box shape as shown in FIG. 1 by photolithography and an etching process.

The piezoelectric device 10 measures, for example, about 2 mm in the expanding direction of the piezoelectric element, that is, in the length direction (direction B in the drawing), about 0.5 mm in width direction, and about 3 µm in thickness. For use as piezoelectric device 10, the oxide piezoelectric thin film 2 must undergo initial polarization, and in this exemplary embodiment, as shown in FIG. 1, the direction of polarization is in the direction of arrow A. The polarization vector is not always required to be vertical to the film surface, and in the case of an oblique polarization vector to the surface, its vertical component may be taken. That is, the entire domain of the oxide piezoelectric thin film 2 is not required to be polarized in the direction of the film thickness.

If spontaneous polarization occurs naturally right after forming the film, such spontaneous polarization may be utilized. The shape of the piezoelectric device 10 is not limited to a box shape. For example, depending on the shape of an apparatus that the piezoelectric device is to be used with, its cross-section may be formed in a trapezoidal, triangular or other shape.

The driving power source 5 is used for applying a specified voltage to the piezoelectric device 10, and the voltage is applied to oxide piezoelectric thin film 2 through the first electrode film 1 and second electrode film 3, and the oxide piezoelectric thin film 2 is expanded or contracted by this voltage.

In this structure, the piezoelectric device 10 can be expanded and contracted in the direction of arrow B depending on the voltage of the driving power source 5. In this exemplary embodiment, this expanding and contracting motion is used as the actuator. That is, fixing one end and setting the other end substantially as a free end, the object to be controlled is fixed to this free end, and hence the object can be positioned precisely. The displacement per voltage depends on the piezoelectric constant $d_{31}$ which is one of the indices of piezoelectric properties, and the greater this value, the larger the displacement of the device.

In the present invention, the oxygen deficiency amount in the film of the oxide piezoelectric thin film 2 is controlled in a range of more than 0% to not more than 10%, preferably more than 2% to 7% or less, or more preferably more than 2% to 5% or less. The present inventor discovered that a piezoelectric device formed by an oxide piezoelectric thin film having such an oxygen deficiency amount has a more favorable piezoelectric characteristic than a piezoelectric device formed by an oxide piezoelectric thin film in an oxidized state of stoichiometric composition. Further, by manufacturing the oxide piezoelectric thin film with such an oxygen deficiency condition, the film forming speed is increased and the mass productivity is improved.

By defining the oxygen deficiency amount more than 0% and not more than 10%, the piezoelectric constant $d_{31}$ can be increased, and hence the displacement of the piezoelectric device can be increased. For example, when using the PZT thin film expressed by a general formula $Pb_{1+Y}(Zr_XTi_{1-X})O_{3+Z}$, the oxygen deficiency ratio $(Y-Z)/(Y+3)$ is set at more than 0 and not more than 0.1 (that is, 10%).

Moreover, when the oxygen deficiency amount is set at more than 2% and 7% or less, fluctuations of the crystal orientation degree can be suppressed, and if the oxygen deficiency amount varies, variation of the displacement of the piezoelectric device can be suppressed to be relatively small. Hence, the manufacturing yield is improved. Further, by defining the oxygen deficiency amount in a range of more than 2% to 5% or less, fluctuations of displacement of the piezoelectric device can be further suppressed. As a result, the manufacturing yield is further improved.

Preferably, the oxide piezoelectric thin film should have a crystal orientation defined so that the axis of polarization coincides with the film thickness direction. For example, a tetragonal PZT thin film should be oriented in (001) direction, and a rhombohedral PZT thin film in (111) direction.

As an example of forming an oxide piezoelectric thin film expressed by a general formula $A_{1+Y}BO_{3+Z}$ (where A and B represent elements) and 70% or more in the crystal orientation degree of an azimuth parallel to the axis of its polarization, a specific manufacturing method is explained below about a PZT thin film expressed by the general formula $Pb_{1+Y}(Zr_XTi_{1-X})O_{3+Z}$ by sputtering, together with results of a measurement of the piezoelectric characteristics.

FIG. 2A to FIG. 2D are sectional views showing the principal process of a manufacturing method of the piezoelectric device 10 in the exemplary embodiment.

Figure 2A:
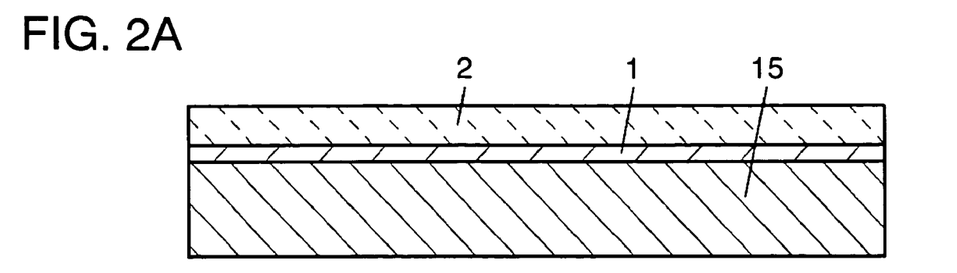
FIG. 2 is a sectional view of a principal process of a manufacturing method of the piezoelectric device in the exemplary embodiment.

The substrate is an MgO substrate of (100) azimuth. On this MgO substrate 15, a Pt film 1 was formed as a first electrode film in a film thickness of 100 nm and in (100) orientation, by sputtering, at a substrate temperature of 500° C., using argon (Ar) gas, at a discharge gas pressure of 0.5 Pa.

On the Pt film 1, a PZT thin film 2 was formed as the oxide piezoelectric thin film in a film thickness of 5 μm. FIG. 2A is a sectional view showing a state of forming the PZT thin film 2. At this time, when the sputtering target was expressed by the general formula $Pb_{1+Y}(Zr_XTi_{1-X})O_{3+Z}$ (where 0<X<1), the sputtering target with a composition of X=0.58 and Y=0.25 was used. At this time, the value of Z was the same as the value of Y.

Discharge gas pressure in sputtering was 0.5 Pa, and substrate temperature was 600° C. At this time, the composition of discharge gas was a mixed gas of Ar gas and oxygen ($O_2$) gas, and the rate of $O_2$ gas in the discharge gas was varied in the condition of 0.5% to 50% of the total gas. Including the forming process of PZT thin film 2, the composition of the discharge gas in the discharge space between the target and the substrate was measured by a mass filter. The prepared PZT thin film 2 was measured by an electron probe microanalysis (EPMA) to determine the film composition and analyzed by X-ray diffraction to evaluate the crystallization.

Figure 2B:
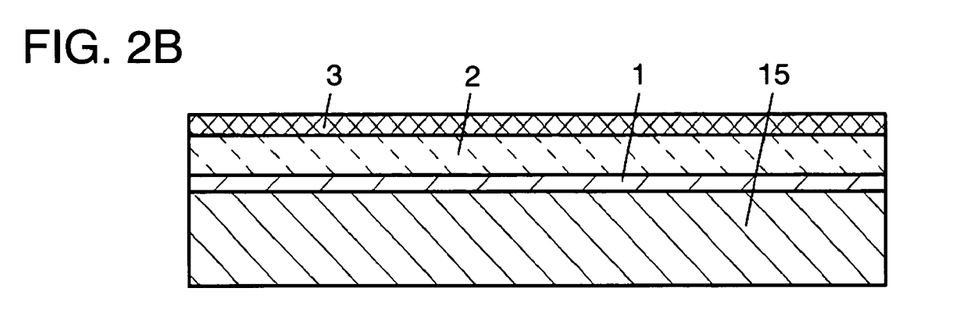

In succession, as a second electrode film, a Pt film 3 was formed on the PZT thin film 2 by sputtering, using Ar gas, at a discharge gas pressure of 0.5 Pa and at ordinary temperature. FIG. 2B is a sectional view showing a state of forming the Pt film 3. In the PZT thin film 2 fabricated in this condition, spontaneous polarization in an upward direction of the substrate surface was confirmed naturally without particularly applying an electric field to induce polarization.

Figure 2C:
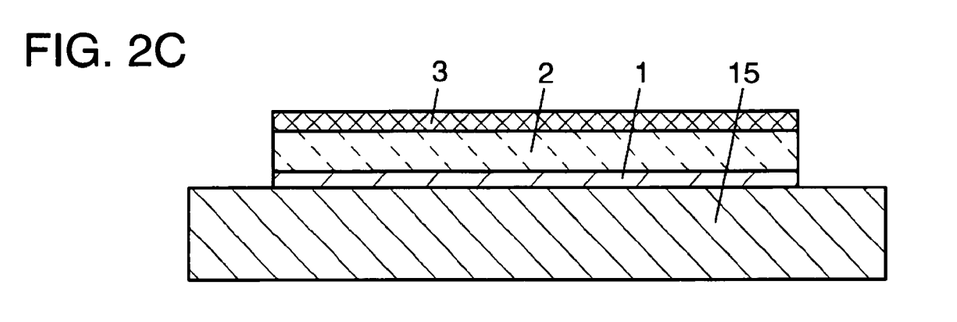

Next, as shown in FIG. 2C, by photolithography and etching process on the MgO substrate 15, a specified piezoelectric device shape was formed. The shape is, as shown in FIG. 1, 2 mm in a longitudinal direction and 0.5 mm in a width direction.

Figure 2D:
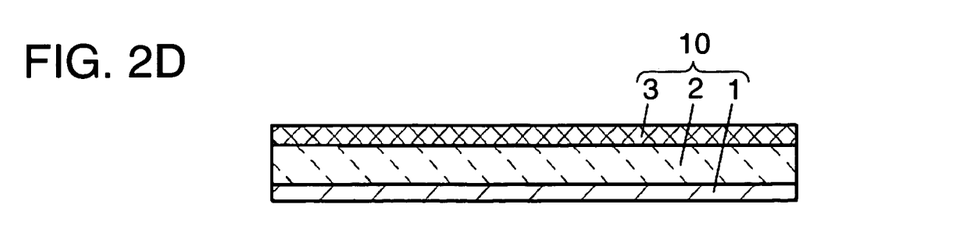

After being processed into a specified shape, as shown in FIG. 2D, the MgO substrate 15 was removed by etching, and the piezoelectric device 10 in the shape as shown in FIG. 1 was obtained.

To the fabricated piezoelectric element 10, a driving power source 5 was connected as shown in FIG. 1, and displacement in direction of arrow B was measured. A voltage of 10V was applied, and displacement was measured as the amount of displacement in the direction of arrow B by using a laser Doppler vibrometer.

Figures 3, 4:
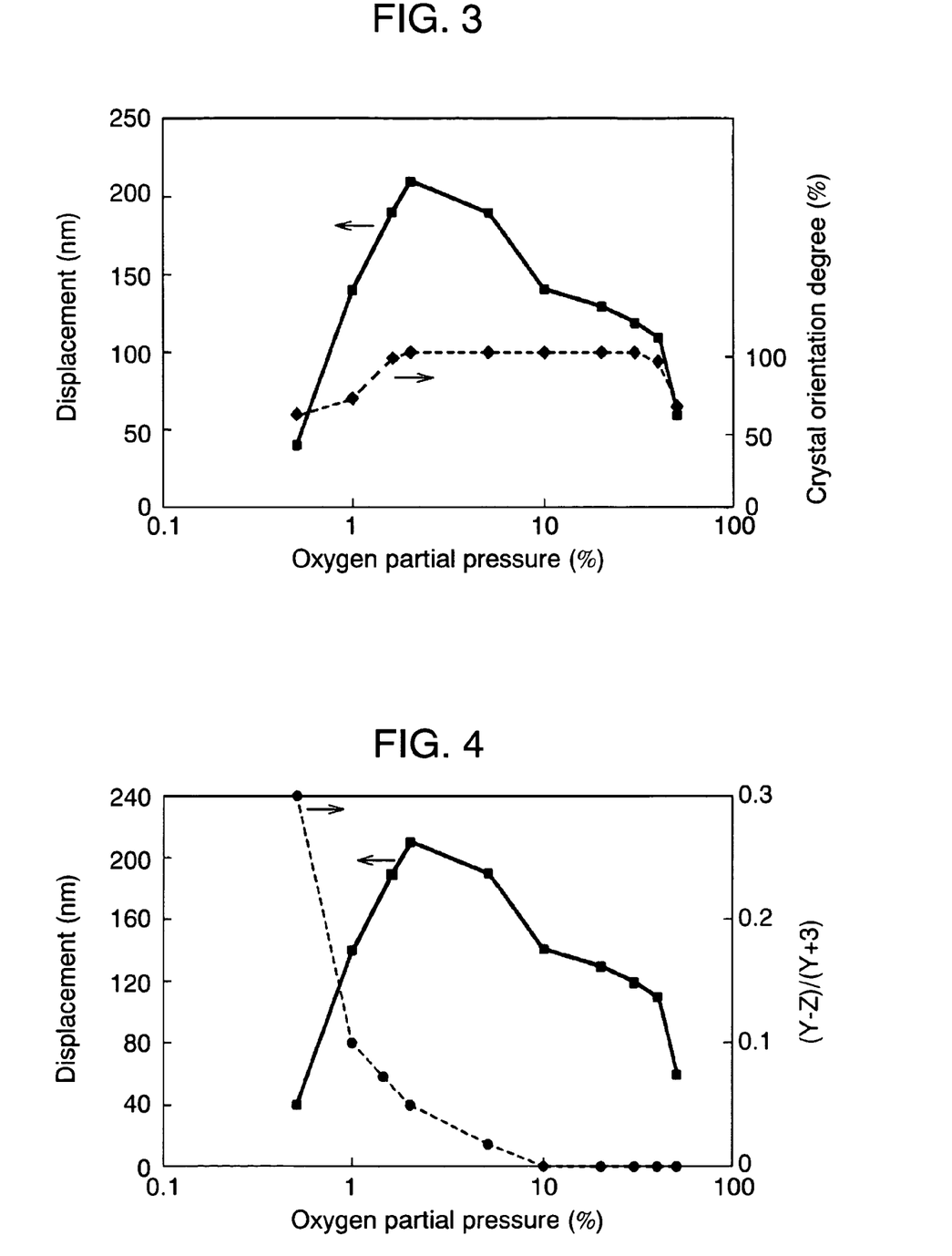
FIG. 3 is a diagram showing the dependence of the crystal orientation degree and the displacement of the piezoelectric device formed by using the target of Y=0.25 composition on the oxygen partial pressure in the sputtering.
FIG. 4 is a diagram showing the dependence of a ratio of the oxygen amount (oxygen deficiency ratio) $(Y-Z)/(Y+3)$ and the displacement of the piezoelectric device on the oxygen partial pressure in the sputtering.

FIG. 3 shows the result of the dependence of the crystal orientation degree and the displacement of piezoelectric device 10 formed by using the target of Y=0.25 composition on the oxygen partial pressure in the sputtering. The axis of abscissa denotes the oxygen partial pressure in a percentage to the total pressure, and the axes of ordinates represent the displacement at the left side and the crystal orientation degree at the right side.

The crystal orientation degree of PZT thin film 2 was determined by an X-ray diffraction apparatus. In X-ray diffraction, a θ–2θ scan was performed by using a Cu—Kα X-ray source. The angle range of 2θ was 20 to 40 degrees. In the tetragonal PZT thin film 2, since the polarization is in (001) direction, the crystal orientation was determined by the peak intensity ratio (001)/Σ(hkl) of X-ray diffraction. A material having polarization in (001) direction is determined by (001)/Σ(hkl), and a material having polarization in (111) direction is determined by (111)/Σ(hkl). Herein, Σ(hkl) is the sum of a reflection peak intensity derived from PZT in the case of setting the upper limit and lower limit of 2θ in a minimum range capable of measuring all (hkl) reflection except for (000) reflection, where h, k and l are 0 or 1, in the θ–2θ scan using Cu-Kα X-ray source. Hereinafter, the crystal orientation degree may be simply called orientation degree.

As is clear from FIG. 3, the orientation degree drops at the oxygen partial pressure of 2% or less, but even at an oxygen partial pressure of 0.5%, the orientation degree is 60%. When the oxygen partial pressure reaches 50%, the orientation degree drops suddenly, but the orientation degree is 65% even in this case. In the range of an oxygen partial pressure of 0.5% to 10%, for example, at the oxygen partial pressure of 1.5%, the orientation degree is 95%, and as the oxygen partial pressure is further increased, the orientation degree gradually increases, and at the oxygen partial pressure of 10%, the orientation degree is 100%. In the range of an oxygen partial pressure of 10% to 30%, the orientation degree is 100%, and at an oxygen partial pressure of 40%, the orientation degree is 96%, and at a higher oxygen partial pressure, the orientation degree falls suddenly.

On the other hand, the displacement increases sharply as the oxygen partial pressure increases from 0.5% to 2%. Exceeding 2%, however, the displacement decreases. The rate of decrease differs around the oxygen partial pressure of about 10%, and a point of inflection is noted.

Figure 5:
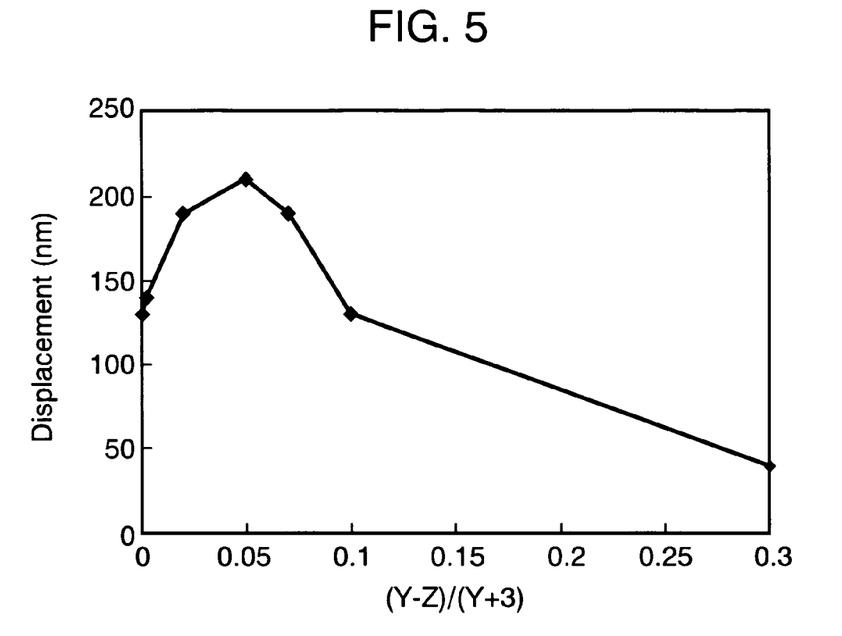
FIG. 5 is a diagram showing the relationship between the oxygen deficiency ratio $(Y-Z)/(Y+3)$ and the displacement of the piezoelectric device in the exemplary embodiment.

FIG. 4 shows the result of the dependence of the oxygen deficiency ratio (Y−Z)/(Y+3) and the displacement of the piezoelectric device 10 on the oxygen partial pressure in the sputtering, similarly using the target of Y=0.25 composition. The axis of abscissa denotes the oxygen partial pressure in percentage to the total pressure, and the axes of ordinates represent the displacement at the left side and the oxygen deficiency ratio (Y−Z)/(Y+3) at the right side. FIG. 5 is a diagram showing the relation between the oxygen deficiency ratio (Y−Z)/(Y+3) and the displacement.

The method of determining the oxygen deficiency ratio (Y−Z)/(Y+3) is explained below. First, the composition of ferroelectric thin film necessary for determining the oxygen deficiency ratio was measured by EPMA as mentioned above. In this method of analysis, a very narrow reduced electron beam flux is emitted to the sample surface, and the wavelength and intensity of the characteristic X-ray radiated from the spot are measured by X-ray spectroscope, and the composition of the sample is determined.

The PZT thin film was quantitatively analyzed as follows. Using a standard sample with known concentration of elements Pb, Zr, Ti and O, the X-ray intensity is measured. Using Pb as an example, suppose the Pb concentration of a standard sample is $W_{Pbstd}$, and the X-ray intensity of this sample is $I_{Pbstd}$. When a PZT thin film of unknown concentration is measured, the X-ray intensity of Pb is $I_{Pb}$. By linear approximation of this data, the Pb concentration $W_{Pb}$ of the PZT thin film of unknown concentration is determined by the following formula.

$$W_{Pb} = W_{Pbstd} \times I_{Pb}/I_{Pbstd}$$

where $I_{Pb}$ and $I_{pbstd}$ are X-ray intensity per unit current after dead time correction and background correction.

By a similar method, concentrations of Zr, Ti and O are determined as $W_{Zr}$, $W_{Ti}$ and $W_O$.

Next, the ZAF correction coefficient is calculated. Z is the atomic number correction, which is determined by calculating the numerical value of Duncumb-Reed by the method of least squares. A is the absorption correction, which is calculated by the formula of Philibert. F is the fluorescence correction, which is calculated by the formula of Reed. From the normalized values of $W_{Pb}$, $W_{Zr}$, $W_{Ti}$, and $W_O$, values of Z, A and F of the first ZAF correction coefficient of each element are calculated, and by multiplying them, a corrected concentration is obtained. Using the obtained values of concentration, the ZAF correction coefficient is calculated again. By using this correction coefficient, a further corrected concentration is determined. Thus, by repeating until the calculation error is 0.001%, a quantitative value is obtained.

The apparatus used in the analysis is a wavelength dispersion type EPMA (JXA-8900R of JEOL Ltd.). The sample is processed in a square shape of about 5 mm in size. It is adhered to the sample stand by carbon paste to achieve conduction, and carbon coating is also applied on the surface.

For actual measurement, first, to measure a film thickness and check for impurities, the sample is inspected by total qualitative analysis. At the same time, it is determined whether the electron beam has invaded down to the matrix. Next, PZT of the standard sample is measured. By reading the value of the standard sample, the sample is analyzed quantitatively. The condition of analysis at this time is acceleration voltage of 15 kV, irradiation current of 70 mA, and beam diameter of 10 μm. After checking for an abnormality of measurement, if measured normally, the measured data is normalized, and the result of the measurement is obtained. By this measuring method, the quantitative values of Pb, Zr, Ti, and O are obtained.

Oxygen deficiency ratio $(Y-Z)/(Y+3)$ is defined as the ratio of the oxygen deficiency amount in the PZT thin film 2 supposing Pb has a valence of two, and Zr and Ti have a valence of four. In other words, if oxidization of Pb completely takes place stoichiometrically, the oxygen (O) amount at this time is the same as that of Pb, that is, $Y+1$, and similarly if oxidization of Zr completely takes place stoichiometrically, the oxygen (O) amount at this time is two times that of Zr, that is, $2\times$, and if oxidization of Ti takes place similarly, the oxygen (O) amount is two times that of Ti, that is, $2(1-X)$. Therefore, in the state of stoichiometric composition, the total oxygen amount is $(Y+1)+2X+2(1-X)=(Y+3)$.

On the other hand, the actual oxygen amount of the fabricated PZT thin film 2 is $(3+Z)$, and the oxygen shortage is $(Y+3)-(3+Z)=(Y-Z)$. Since the total oxygen amount of stoichiometric composition is $(Y+3)$, the rate of oxygen deficiency amount is the ratio of the two, that is, $(Y-Z)/(Y+3)$. Thus, $(Y-Z)/(Y+3)$ represents the oxygen deficiency ratio. The values of X, Y and Z are easily obtained by calculating on the basis of values of $W_{Pb}$, $W_{Zr}$, $W_{Ti}$ and $W_O$ because they are determined from the quantitative analysis results by EPMA.

As shown in FIG. 4, at the oxygen partial pressure of 1% or less, it is found that the oxygen deficiency ratio $(Y-Z)/(Y+3)$ increases suddenly along with a decline of oxygen partial pressure. That is, at the oxygen partial pressure of 1% or less, it is known that much oxygen deficiency occurs in the PZT thin film 2. As the oxygen partial pressure exceeds 1%, the oxygen deficiency ratio gradually becomes smaller, and at the oxygen partial pressure of 10%, the oxygen deficiency ratio is 0.2% (0.002), and at a higher oxygen partial pressure, a PZT thin film of stoichiometric composition is obtained.

As further shown in FIG. 4, from the oxygen partial pressure of 10% where the oxygen deficiency ratio is 0.2%, to the oxygen partial pressure of 2% where the oxygen deficiency ratio is 5% (0.05), there is an almost linearly increasing tendency of displacement along with the increase of the oxygen deficiency ratio. However, when the oxygen deficiency ratio exceeds 5% (0.05), the displacement becomes smaller, and in this region there is no correlation with the oxygen deficiency ratio. The cause is the decline of the orientation degree as shown in FIG. 3.

FIG. 5 is a diagram showing the relation between the oxygen deficiency ratio $(Y-Z)/(Y+3)$ and the displacement. The displacement shows the maximum value at the oxygen deficiency ratio of about 5% (0.05). When the oxygen deficiency ratio is smaller than 5%, the displacement decreases gradually. On the other hand, at the oxygen deficiency ratio of over 5%, it decreases similarly, but at the oxygen deficiency ratio of around 10%, it seems that there is a point of inflection in the displacement.

Summing up these results, to increase the displacement of the piezoelectric device 10, it has been found effective to cause a certain oxygen deficiency in the PZT thin film 2. The upper limit of the oxygen deficiency ratio is 0.1 when the orientation degree of PZT thin film 2 is 70% or more. This is because it is known from FIG. 4 that the oxygen deficiency ratio of 0.1 or less is required in order to assure a greater displacement than in the case free from oxygen deficiency at the orientation degree of 100%. At this time, the oxygen partial pressure is required to be in a range of more than 1% and not more than 10%.

Further, when the oxygen deficiency ratio is in a range of 2% (0.02) to 7% (0.07), as clear from FIG. 5, the range covers the peak value of the displacement, and if the oxygen deficiency fluctuates, variations of the displacement can be suppressed to be relatively small. Hence, the manufacturing yield can be improved. Moreover, at the oxygen deficiency ratio of 2% or more and 5% or less, variations of the displacement may be suppressed further for the oxygen deficiency ratio. Hence, the manufacturing yield can be further improved.

In the oxygen deficiency ratio range of 2% to 7%, the oxygen partial pressure should be set in a range of 1.5% or more and smaller than 5%.

Figure 6:
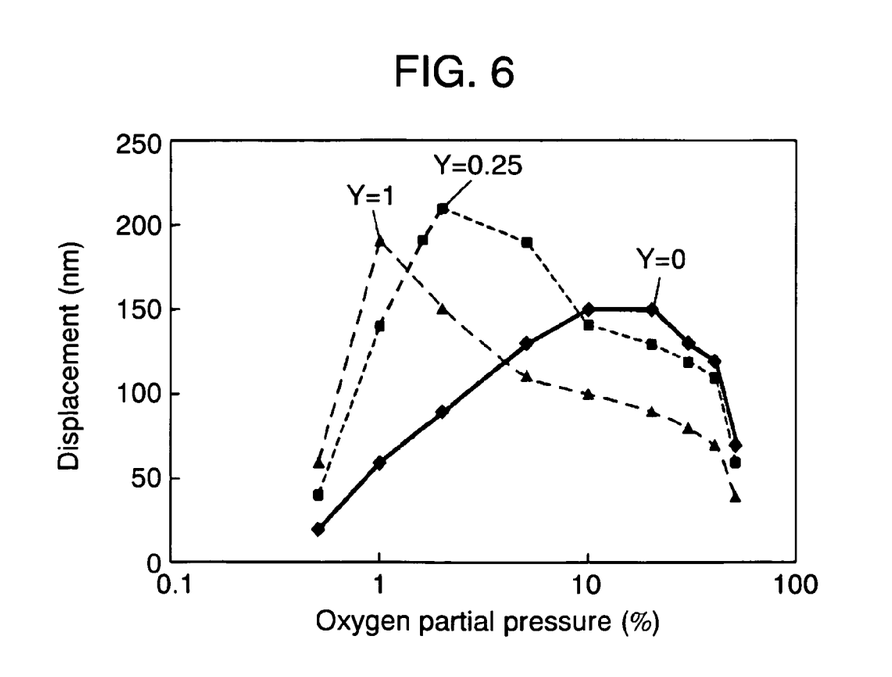
FIG. 6 is a diagram showing the relationship between the displacement of the piezoelectric device manufactured by using a target with a different composition (Y=0, Y=0.25, and Y=1) and the oxygen partial pressure in the sputtering.

FIG. 6 shows the relation between the oxygen partial pressure in the discharge gas when forming the film and the displacement of the piezoelectric device 10 formed by the PZT thin film 2, which is fabricated respectively by using three types of targets (Y=0, Y=0.25, and Y=1), of which composition is expressed by the general formula $Pb_{1+Y}(Zr_xTi_{1-x})O_{3+Z}$ (where 0<x<1). However, the composition of X=0.58 is constant.

Using the target of Y=0, the displacement has its peak in a range of oxygen partial pressure of 10% to 20%, and the displacement is small on the whole. Because of the target of Y=0, the PZT thin film formed by using this target is in a Pb shortage state.

Using the target of Y=1, the displacement has a peak locally at the oxygen partial pressure of around 1%.

On the other hand, using the target of Y=0.25, the range of obtaining a large displacement is wider, and the PZT thin film 2 can be manufactured at a higher yield.

Incidentally, as is clear from FIG. 6, as the value of "Y" showing the Pb composition in the target becomes larger than 0, the oxygen partial pressure showing the peak of displacement tends to be smaller. Although not shown in FIG. 6, by varying the value of Y further, the relation with the displacement was studied. As a result, in a range of 0<Y<1, by forming the film in a range of oxygen partial pressure of 1% to 10%, it has been found that the piezoelectric characteristic is favorable while the mass productivity and yield are improved. This oxygen partial pressure may be achieved by controlling the ratio of the feeding Ar gas and $O_2$ gas while analyzing the discharge gas by a mass filter during sputtering. In the case of the target of $Pb_{1+Y}(Zr_XTi_{1-X})O_{3+Z}$ wherein Z is nearly 0, a similar piezoelectric thin film is obtained by feeding the discharge gas by setting the flow rate ratio of Ar and $O_2$ for achieving the range specified above.

In this exemplary embodiment, when expressed by the general formula $Pb_{1+Y}(Zr_XTi_{1-X})O_{3+Z}$ (where 0<x<1), the target of X=0.58 is constant and Z of the same value as Y is used. However, the value of Z in the oxygen composition of the target is not limited to the same value as Y in the Pb composition, but each value may be set individually. That is, as far as in a range of $-3 \leq Z \leq Y$, by setting the oxygen content in the discharge gas in sputtering in the above range and properly controlling the film forming speed, an oxide piezoelectric thin film having favorable piezoelectric characteristics can be formed.

In this exemplary embodiment, the MgO substrate of (100) azimuth was used as the substrate, but the invention is not limited to this example. For example, other substrates may be used, such as single crystal silicon substrate, single crystal strontium titanate substrate, sapphire substrate, sintered alumina substrate, and zirconia substrate. If spontaneous polarization does not take place by using such substrates, polarization may be processed after forming the oxide piezoelectric thin film.

In this exemplary embodiment, the Pt film was used as the first electrode film, but the invention is not limited to this example alone. Other conductive materials may be used such as gold (Au), palladium (Pd), rhodium (Rh), iridium (Ir), ruthenium (Ru), or their oxides which have electrical conductivity.

In this exemplary embodiment, the Pt film was also used as the second electrode film, but the invention is not limited to this example alone. For example, the same materials as used for the first electrode film may be used. Further, metal materials such as aluminum (Al), copper (Cu), nickel (Ni) and others may be used without any limitation.

In this exemplary embodiment, the piezoelectric device is manufactured by photolithography and etching process, but the invention is not limited to such a process. For example, by using a mask, a specified shape may be formed by sputtering or vapor deposition.

Second Exemplary Embodiment

Figure 7:
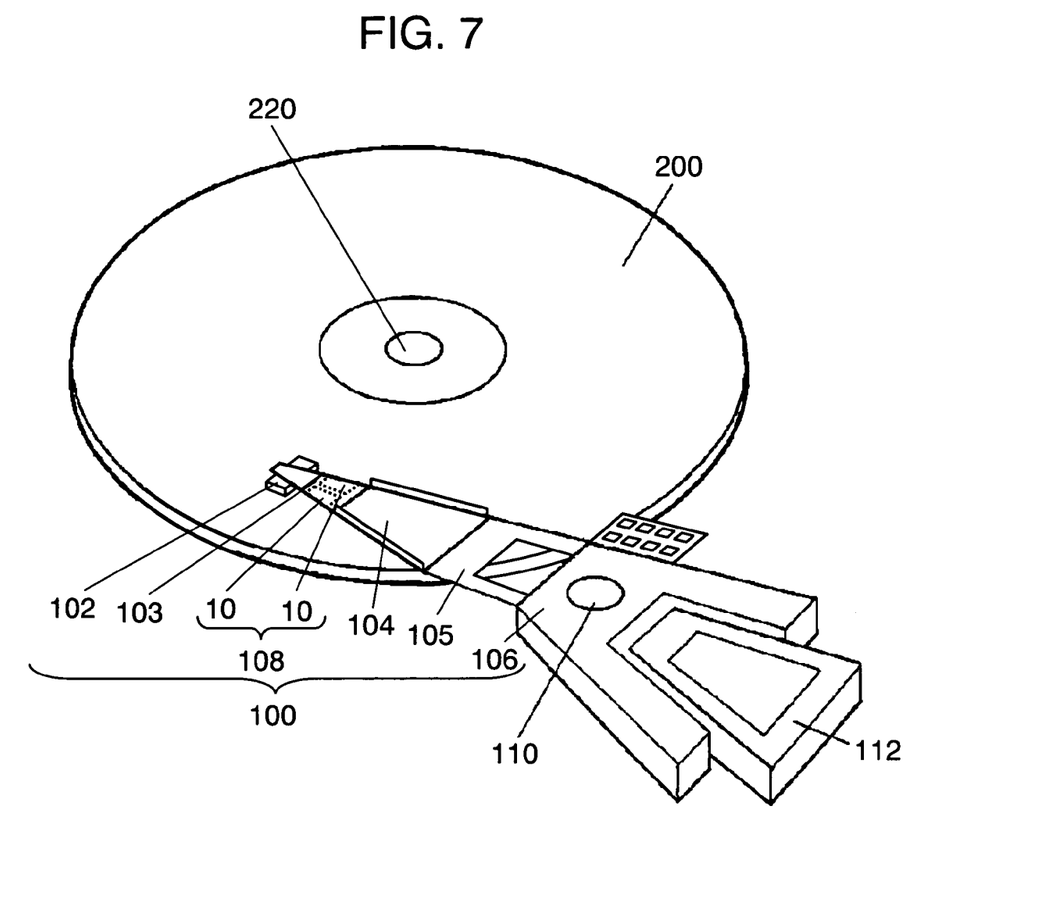
FIG. 7 is a diagram showing an example of using the piezoelectric device in the exemplary embodiment for positioning a magnetic head of a magnetic disk device.

The second exemplary embodiment refers to a case of manufacturing an actuator composed of a piezoelectric device fabricated in the method explained in the first exemplary embodiment, and using this actuator for positioning a magnetic disk of a magnetic disk drive device. FIG. 7 is a schematic diagram of a device configuration using the piezoelectric device in this exemplary embodiment for positioning the magnetic head of a magnetic disk drive device. This magnetic disk drive device is characterized by a two-stage actuator configuration adding the actuator composed of the piezoelectric device of the invention to the actuator composed of a conventional voice coil motor. A head support mechanism 100 comprises a suspension 104 of a relatively low rigidity, a plate spring 105, an arm 106 of a relatively high rigidity, a flexure 103, a slider 102 mounted on this flexure 103 on the side facing a disk 200, a head (not shown) mounted on this slider 102, and a piezoelectric device 108 adhered and fixed on the flexure 103.

The suspension 104 is designed at a relatively low rigidity, and its other end forms the plate spring 105, and this plate spring 105 is fixed to the arm 106. A voice coil motor is composed of a voice coil 112 attached to the arm 106 and a magnet not shown in the drawing. The head support mechanism 100 can be rotated by this voice coil motor in a specified angle range in a direction parallel to the plane of the disk 200.

The piezoelectric device 108 is driven for positioning the head mounted on the slider 102 at high precision on a specified track position of the disk 200. That is, this head support mechanism 100 has a two-stage actuator structure of positioning roughly by the voice coil motor, and adjusting finely by the piezoelectric device 108.

The operation of this magnetic disk drive device is explained below. The disk 200 is rotated at a specified speed by a rotary driving means 220. In a recording and reproducing operation of the magnetic disk drive device, the slider 102 flies by a specified flying height by the balance of the buoyancy of the air stream caused by rotation of the disk 200 and the thrusting force of forcing the slider 102 to the disk 200 side, and the head records and reproduces in this specific flying height. By recording and reproducing in such a flying height, to position the head at the specified track position, the arm 106 is rotated by the voice coil motor about the bearing 110. Ina conventional magnetic disk drive device, positioning is attempted by the voice coil motor only, but in the magnetic disk drive device of the present exemplary embodiment, positioning with higher precision is achieved by the piezoelectric device 108.

Figure 8A:
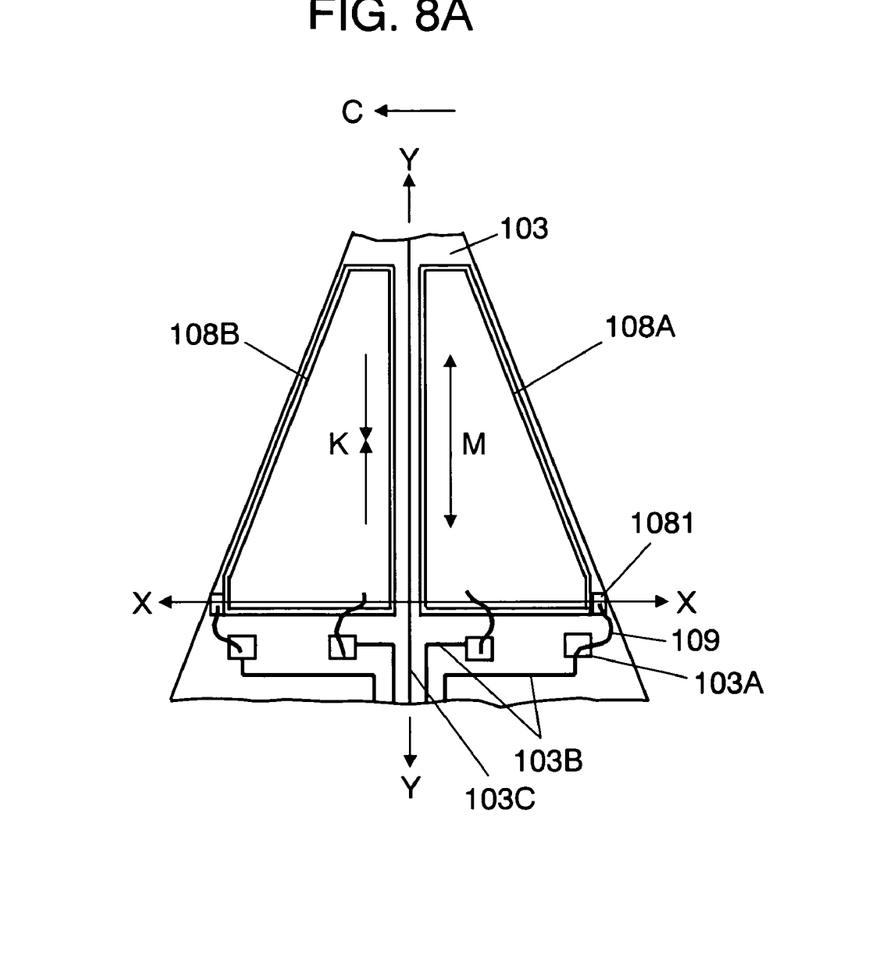
FIG. 8A is a plan view showing the shape near the piezoelectric device of the magnetic disk device in the exemplary embodiment.
Figure 8B:
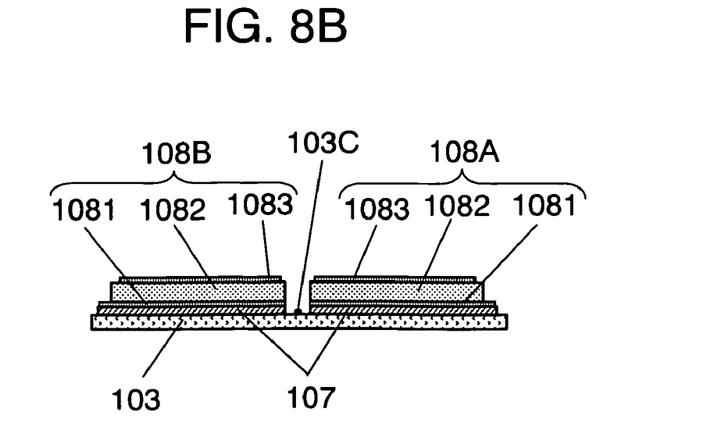
FIG. 8B is a sectional view along line X—X in FIG. 8A.

FIG. 8A and FIG. 8B show the shape near the piezoelectric device 108. FIG. 8A is a plan view, and FIG. 8B is a sectional view along line X—X in FIG. 8A. A pair of piezoelectric devices 108A, 108B are adhered and fixed on the flexure 103 by way of an adhesive layer 107 at symmetrical positions to the center line Y—Y in the longitudinal direction of the suspension. The piezoelectric devices 108A, 108B are symmetrical to the line Y—Y, and are identical in sectional structure. That is, the piezoelectric devices 108A, 108B are formed by a first electrode film 1081 and a second electrode film 1083 so as to enclose a PZT thin film 1082. On the surface of the piezoelectric devices 108A, 108B, an insulating protective resin film may be formed. The first electrode film 1081 and second electrode film 1083 of the piezoelectric devices 108A, 108B are connected by means of an electrode pad 103A of the flexure 103 and a wire lead 109. From the electrode pad 103A, a piezoelectric electrode wiring 103B to be connected to a control unit (not shown) of a magnetic disk apparatus is formed on the flexure 103. To connect the head mounted on the slider 102 and the control unit (not shown) of the magnetic disk apparatus, a head electrode wiring 103C is formed on the flexure 103 in the middle of the pair of piezoelectric devices 108A, 108B.

In the piezoelectric device 108 in this head support mechanism 100, a voltage 10 V was applied, and the displacement of the head (not shown) was measured. As a result, in the case of the PZT thin film of which an oxygen deficiency ratio is $0<(Y-Z)/(Y+3)\leq 0.1$, the generated displacement was more than 2 times as compared with the piezoelectric device of a conventional PZT thin film. Therefore, as compared with the conventional piezoelectric device, a fine positioning is possible in a wider range, and a magnetic disk apparatus of a higher recording density is realized.

In the piezoelectric devices 108A, 108B shown in FIG. 8A and FIG. 8B, the PZT thin film 1082 is enclosed by the first electrode film 1081 and second electrode film 1083, and there is only one layer of PZT thin film 1082, but plural layers of PZT thin film may be laminated by gluing the films together with adhesive or the like. By laminating, a greater displacement driving force may be obtained.

In the PZT thin film of this exemplary embodiment, the crystal structure is a tetragonal system of (001) orientation, and in the tetragonal PZT, since the polarization is in (001) direction, orientation in (001) is advantageous for piezoelectric characteristics. In the case of a PZT thin film of a rhombohedral system, since the polarization is in (111) direction, the orientation in (111) is advantageous for piezoelectric characteristics.

In this exemplary embodiment, for the general formula $Pb_{1+Y}(Zr_XTi_{1-X})O_{3+Z}$, the case of X=0.58 is disclosed, but the invention is not limited to this example alone. In the PZT, the crystal structure depends on the composition of X, and the composition around the boundary of a tetragonal system and rhombohedral system is called MPB (morphotropic phase boundary) composition, and it is known that the piezoelectric performance is higher. By using the composition in this vicinity, not limited to X=0.58, a piezoelectric device of high piezoelectric characteristic may be obtained. The value of X in the boundary of a tetragonal system and rhombohedral system depends on the film forming method, amount of additives and others, and it may be adjusted properly.

In this exemplary embodiment, PZT is disclosed as the material for the piezoelectric thin film, but additive elements may be added as required and the material characteristic may be adjusted. In such a case, the oxygen deficiency amount may be calculated in consideration of the amount of additives and the valence. Additive elements and valence are, for example, as follows. Group 1 elements have a valence of one, and group 2 elements, for example, Mn, Ni, Cu, Zn, Sm, Eu, and Yb have a valence of two, Sc, Y, Cr, B, Al, Ga, In, Sb, Bi, La, Nd, Pm, Gd, Dy, Ho, Er, Tm, and Lu have a valence of three, and Hf, Ir, Si, Ge, Sn, Ce, Pr, and Tb have a valence of four.

In this exemplary embodiment, a PZT thin film was directly formed on the Pt film, but to improve the crystallinity and crystal orientation of the PZT thin film, a base film may be formed on the Pt film, and a PZT thin film may be formed thereon.

In this exemplary embodiment, heat treatment is not performed after forming the film, but heat treatment may be also performed for improving the crystallinity and crystal orientation of the PZT thin film.

Films are formed by sputtering in this exemplary embodiment, but the present invention is not limited to sputtering. A PZT thin film formed by laser ablation is also confirmed to enhance a piezoelectric performance by forming a film having an oxygen deficiency. The present invention is not limited to a PZT thin film, and the effects of the present invention can be obtained in any other oxide piezoelectric thin film.

In the piezoelectric device of the present invention, the crystal structure of the piezoelectric thin film may have a perovskite tetragonal system, and the azimuth parallel to the axis of polarization may be (001) plane azimuth, or the crystal structure of the piezoelectric thin film may have a perovskite rhombohedral system, and the azimuth parallel to the axis of polarization may be (111) plane azimuth. Thus, the piezoelectric device manufactured by using a tetragonal PZT thin film or a rhombohedral PZT thin film as the piezoelectric material comes to have a great piezoelectric performance.

In the piezoelectric device of the present invention, part of Pb in the general formula $Pb_{1+Y}(Zr_XTi_{1-X})O_{3+Z}$ (where 0<X<1) may be replaced by at least one element selected from the group consisting of group 2 elements of manganese (Mn), nickel (Ni), copper (Cu), zinc (Zn), samarium (Sm), europium (Eu), and ytterbium (Yb). In the composite oxide piezoelectric thin film which adds one or more elements thereof, the piezoelectric performance may be further improved by defining the oxygen deficiency in a range of more than 0% to not more than 10%.

Further, in the piezoelectric device of the present invention, part of at least Ti or Zr in the general formula $Pb_{1+Y}(Zr_XTi_{1-X})O_{3+Z}$ (where 0<X<1) may be replaced by at least one element selected from the group consisting of hafnium (Hf), iridium (Ir), silicon (Si), germanium (Ge), tin (Sn), cerium (Ce), praseodymium (Pr), and terbium (Tb). In the composite oxide piezoelectric thin film which replaces at least Ti or Zr with one or plural elements thereof, the piezoelectric performance may be further improved by defining the oxygen deficiency in a range of more than 0% to not more than 10%.

Further, in the piezoelectric device of the present invention, part of at least Pb, Ti or Zr in the general formula $Pb_{1+Y}(Zr_XTi_{1-X})O_{3+z}$ (where 0<X<1) may be replaced by at least one element selected from the group consisting of group 1 elements of valence of one, that is, scandium (Sc), yttrium (Y), chromium (Cr), boron (B), aluminum (Al), gallium (Ga), indium (In), antimony (Sb), bismuth (Bi), lanthanum (La), neodymium (Nd), promethium (Pm), gadolinium (Gd), dysprosium (Dy), holmium (Ho), erbium (Er), thulium (Tm), and lutetium (Lu). In the composite oxide piezoelectric thin film which replaces at least Pb, Ti or Zr with one or plural elements thereof, the piezoelectric performance may be further improved by defining the oxygen deficiency in range of more than 0% to not more than 10%.

Also in the first exemplary embodiment and the second exemplary embodiment, the method of manufacturing the piezoelectric thin film by sputtering is explained, but the invention is not limited to this example alone. For example, on the first electrode film, an oxide piezoelectric thin film expressed by a general formula $A_{1+Y}BO_{3+Z}$ (where A and B represent elements) and 70% or more in the crystal orientation degree of an azimuth parallel to the axis of its polarization may be formed by a laser ablation method. By forming the film in a discharge gas atmosphere with the oxygen partial pressure control at a high precision in the vacuum apparatus during the film forming process, crystal growth of an oxide piezoelectric thin film is realized while precisely controlling the oxygen deficiency amount, and the distribution of oxygen deficiency in the film may be made homogeneous.

By contrast, for example, when forming a piezoelectric element by a powder sintering method, although oxygen deficiency can be formed by baking in a low oxygen atmosphere, in this case the oxygen deficiency is likely to be localized, and the reliability is lowered. In the case of a chemical vapor deposition (CVD) method, unlike the sputtering method or laser ablation method, since the film is formed by oxidation and decomposition of reaction gas, it is relatively difficult to form a piezoelectric thin film having excellent piezoelectric characteristics at a low oxygen partial pressure.

On the other hand, in the oxide piezoelectric thin film formed by a sputtering method or a laser ablation method, a specified oxygen deficiency is homogeneously present in the film, and a piezoelectric thin film of large piezoelectric performance and high reliability is obtained. By sputtering in a state of the oxygen partial pressure exceeding 10%, oxygen deficiency is not formed, and the film forming speed cannot be increased. On the other hand, if the oxygen partial pressure is less than 1%, the rate of crystals parallel to the axis of polarization is lowered, and a piezoelectric characteristic is not improved. That is, to obtain a necessary piezoelectric characteristic, the crystal orientation degree of 70% or more is required, and the oxygen partial pressure is required to be more than 1% for this purpose. By sputtering at a relatively low oxygen partial pressure, the film forming rate is higher and the mass producibility is improved.

In the sputtering method or laser ablation method, the gas feed flow rate into the vacuum apparatus may be 0.01 or more to less than 0.1 as the ratio of the oxygen gas feed flow rate to the total gas feed flow rate. As a result, in the discharge gas pressure condition of relatively low pressure, an oxide piezoelectric thin film of specified oxygen deficiency ratio can be obtained, and film forming at a high speed is realized, and the mass producibility is greatly enhanced.

The invention claimed is:

1. A piezoelectric device comprising:
   a first electrode film;
   a second electrode film; and
   a piezoelectric thin film sandwiched by the first electrode film and the second electrode film,
   wherein the piezoelectric thin film is an oxide piezoelectric thin film having an oxygen deficiency amount of more than 0% and not more than 10% of a stoichiometric composition.

2. The piezoelectric device of claim 1,
   wherein the piezoelectric thin film is a lead zirconic titanate expressed by a general formula of $Pb_{1+Y}(Zr_XTi_{1-X})O_{3+Z}$,
   wherein $0<X<1$, and
   wherein a ratio of the oxygen deficiency amount in the piezoelectric thin film expressed as $(Y-Z)/(Y+3)$ is in a range of $0<(Y-Z)/(Y+3)\leq 0.1$.

3. The piezoelectric device of claim 2,
   wherein the piezoelectric thin film has a crystal orientation degree of an azimuth parallel to an axis of polarization of 70% or more.

4. The piezoelectric device of claim 2,
   wherein the piezoelectric thin film has a crystal structure of a perovskite tetragonal system, and a crystal orientation oriented in a (001) direction.

5. The piezoelectric device of claim 2,
   wherein the piezoelectric thin film has a crystal structure of a perovskite rhombohedral system, and a crystal orientation oriented in a (111) direction.

6. The piezoelectric device of claim 2,
   wherein a part of Pb in the general formula $Pb_{1+Y}(Zr_XTi_{1-X})O_{3+Z}$ is replaced by at least one element selected from the group consisting of group 2 elements of manganese (Mn), nickel (Ni), copper (Cu), zinc (Zn), samarium (Sm), europium (Eu) and ytterbium (Yb).

7. The piezoelectric device of claim 2,
   wherein a part of at least one element selected from Ti and Zr in the general formula $Pb_{1+Y}(Zr_XTi_{1-X})O_{3+Z}$ is replaced by at least one element selected from the group consisting of hafnium (Hf), iridium (Ir), silicon (Si), germanium (Ge), tin (Sn), cerium (Ce), praseodymium (Pr) and terbium (Tb).

8. The piezoelectric device of claim 2,
   wherein a part of at least one element selected from Pb, Ti and Zr in the general formula $Pb_{1+Y}(Zr_XTi_{1-X})O_{3+Z}$ is replaced by at least one element selected from the group consisting of group 1 elements of valence of 1,
   wherein the group 1 elements of valence of 1 include scandium (Sc), yttrium (Y), chromium (Cr), boron (B), aluminum (Al), gallium (Ga), indium (In), antimony (Sb), bismuth (Bi), lanthanum (La), neodymium (Nd), promethium (Pm), gadolinium (Gd), dysprosium (Dy), holmium (Ho), erbium (Er), thulium (Tm) and lutetium (Lu).

9. The piezoelectric device of claim 1,
   wherein the piezoelectric thin film is manufactured by a sputtering method or a laser ablation method.

* * * * *